(12) United States Patent
Kobayashi et al.

(10) Patent No.: US 11,043,443 B2
(45) Date of Patent: Jun. 22, 2021

(54) ELECTRIC DEVICE AND HEAT RADIATOR

(71) Applicant: TDK CORPORATION, Tokyo (JP)

(72) Inventors: Masayuki Kobayashi, Tokyo (JP);
Masayuki Sugasawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/571,283

(22) Filed: Sep. 16, 2019

(65) Prior Publication Data

US 2020/0091033 A1    Mar. 19, 2020

(30) Foreign Application Priority Data

Sep. 19, 2018 (JP) .............................. JP2018-174967

(51) Int. Cl.
*H01L 23/40* (2006.01)
*H05K 7/20* (2006.01)
*F28F 13/06* (2006.01)
*H05K 1/18* (2006.01)

(52) U.S. Cl.
CPC .......... *H01L 23/4093* (2013.01); *F28F 13/06* (2013.01); *H05K 7/2039* (2013.01); *F28F 2215/08* (2013.01); *H05K 1/184* (2013.01)

(58) Field of Classification Search
CPC ... H01L 23/4093; F28F 13/06; F28F 2215/08; H05K 7/2039; H05K 1/184
See application file for complete search history.

(56) References Cited

U.S. PATENT DOCUMENTS

| | | | | |
|---|---|---|---|---|
| 4,707,726 A | * | 11/1987 | Tinder | H01L 23/4006 165/80.1 |
| 5,450,284 A | * | 9/1995 | Wekell | H01L 23/4006 257/719 |
| 5,815,371 A | * | 9/1998 | Jeffries | G06F 1/184 165/185 |
| 5,844,312 A | * | 12/1998 | Hinshaw | H01L 23/4093 257/718 |
| 5,969,946 A | * | 10/1999 | Lai | H05K 7/1431 174/16.3 |
| 6,075,703 A | * | 6/2000 | Lee | H01L 23/4093 174/16.3 |

(Continued)

FOREIGN PATENT DOCUMENTS

JP    S63-128742 U    8/1988
JP    3139856 U       3/2008

*Primary Examiner* — Stephen S Sul
*Assistant Examiner* — Michael A Matey
(74) *Attorney, Agent, or Firm* — Oliff PLC

(57) ABSTRACT

Provided are an electric device and a heat radiator capable of suppressing vibration caused by external stress of the heat radiator. The electric device includes a substrate; an electronic component attached to the substrate; and a heat radiator including at least one first fin, and a second fin facing the first fin, thermally connected to the first fin, and provided at a position closer to an attachment surface of the substrate than any of the first fins. The heat radiator is thermally connected to the electronic component, and one end of an attachment member is attached to the first fin, and another end of the attachment member is attached to the substrate. The attachment member has a height with respect to the attachment surface that is higher than a thickness of the first fin.

14 Claims, 8 Drawing Sheets

(56) References Cited

U.S. PATENT DOCUMENTS

| | | | | |
|---|---|---|---|---|
| 6,735,084 | B1* | 5/2004 | Choi | H01L 23/4006 |
| | | | | 165/185 |
| 6,801,432 | B2* | 10/2004 | Petricek | H05K 3/301 |
| | | | | 257/718 |
| 8,670,239 | B2* | 3/2014 | Hasegawa | H01L 23/4006 |
| | | | | 257/717 |
| 8,797,743 | B2* | 8/2014 | Taka | H05K 7/20154 |
| | | | | 361/710 |
| 2002/0141161 | A1* | 10/2002 | Matsukura | H01L 23/42 |
| | | | | 361/713 |
| 2002/0145854 | A1* | 10/2002 | Lin | H01L 23/367 |
| | | | | 361/719 |
| 2004/0031586 | A1* | 2/2004 | Rearick | H01L 23/4093 |
| | | | | 165/80.2 |
| 2005/0264998 | A1* | 12/2005 | McCutcheon | H01L 23/4006 |
| | | | | 361/702 |
| 2013/0025823 | A1* | 1/2013 | Gamborg | H01L 23/4093 |
| | | | | 165/80.2 |
| 2013/0112682 | A1* | 5/2013 | Yoon | H01L 23/40 |
| | | | | 219/530 |
| 2013/0308275 | A1* | 11/2013 | Yamanaka | H05K 7/2039 |
| | | | | 361/717 |
| 2015/0146380 | A1* | 5/2015 | Lu | H05K 7/20409 |
| | | | | 361/709 |
| 2015/0230362 | A1* | 8/2015 | Kobayashi | H05K 7/20509 |
| | | | | 361/709 |
| 2016/0057891 | A1* | 2/2016 | Chang | B23P 15/26 |
| | | | | 165/80.2 |
| 2019/0166692 | A1* | 5/2019 | Kuo | H05K 1/115 |

\* cited by examiner

ELECTRIC DEVICE AND HEAT RADIATOR

BACKGROUND OF THE INVENTION

Field of the Invention

The present invention relates to an electric device and a heat radiator.

Priority is claimed on Japanese Patent Application No. 2018-174967, filed Sep. 19, 2018, the content of which is incorporated herein by reference.

Description of Related Art

Currently, since increase in functionality of electrical devices has progressed, a heat radiator that efficiently radiates heat generated by electronic components such as semiconductor elements mounted on the electric device has become important. For example, Patent Document 1 discloses a heat radiator that is attached to an electronic substrate by a heat radiator fixing panel terminal. The heat radiator fixing panel terminal has an attachment groove insertion part that is attached to an attachment groove of the heat radiator, and an electronic substrate attachment leg part that is attached to the electronic substrate, and has an abutment part formed to be inclined at a predetermined angle toward an end face side to abut on the end face when attached to the attachment groove.

PATENT DOCUMENTS

[Patent Document 1] Japanese Registered Utility Model No. 3139856

However, the aforementioned heat radiator is attached to the electronic substrate by inserting the attachment groove insertion part of the heat radiator fixing panel terminal into the attachment groove formed in the outermost radiation panel. In such a structure, a distance between the attachment groove insertion part and the electronic substrate attachment leg part is shortened. Further, in such a structure, an interval is generated between the outermost radiation panel and the substrate. For this reason, since the heat radiator easily vibrates due to external stress such as external vibration and impact, the electronic components may be damaged, and the electronic components may not fully exhibit their original characteristics.

Therefore, an object of the present invention is to provide an electric device and a heat radiator in which vibration caused by external stress on the heat radiator can be suppressed.

SUMMARY OF THE INVENTION

According to an aspect of the present invention, there is provided an electric device including a substrate; an electronic component attached to the substrate; and a heat radiator including at least one first fin, and a second fin facing the first fin, thermally connected to the first fin, and provided at a position closer to an attachment surface to the substrate than any of the first fins, wherein the heat radiator thermally connected to the electronic component, by attaching one end of an attachment member for attachment to the substrate to a portion which is a part of the first fin or a part of the second fin and in which a height with respect to the attachment surface is higher than a thickness of the first fin.

Further, according to another aspect of the present invention, there is provided a heat radiator including at least one first fin; and a second fin facing the first fin, thermally connected to the first fin, and provided on the same side as viewed from all the first fins, wherein one end of an attachment member for attachment to the substrate is attached to a portion which is a part of the first fin or a part of the second fin and in which a height with respect to the attachment surface to the substrate is higher than a thickness of the first fin.

According to the present invention, it is possible to suppress vibration caused by external stress of the heat radiator.

DETAILED DESCRIPTION OF THE INVENTION

First Embodiment

Figure 1:
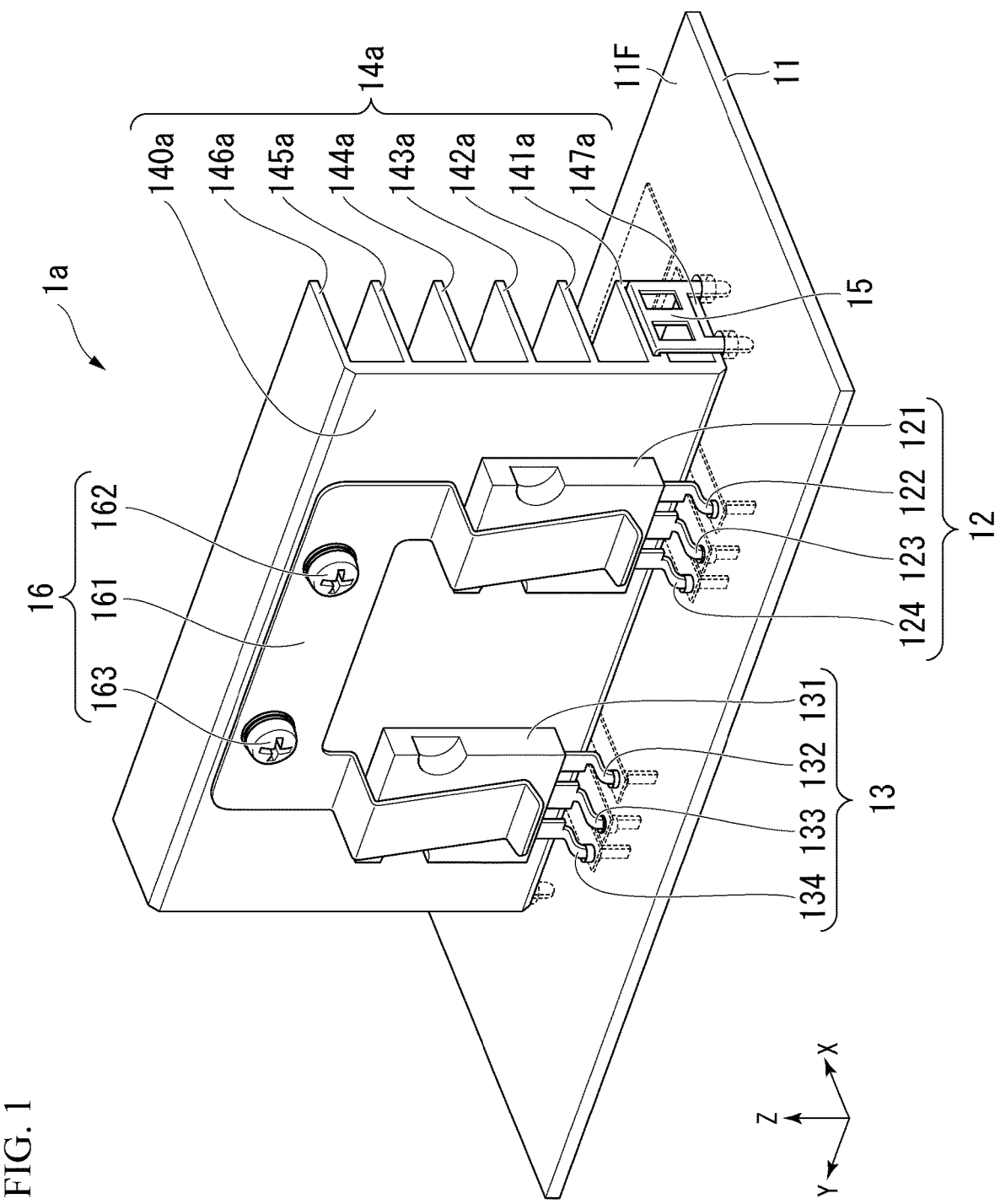
FIG. 1 is a perspective view showing an example of a configuration of an electric device according to the first embodiment.
Figure 2:
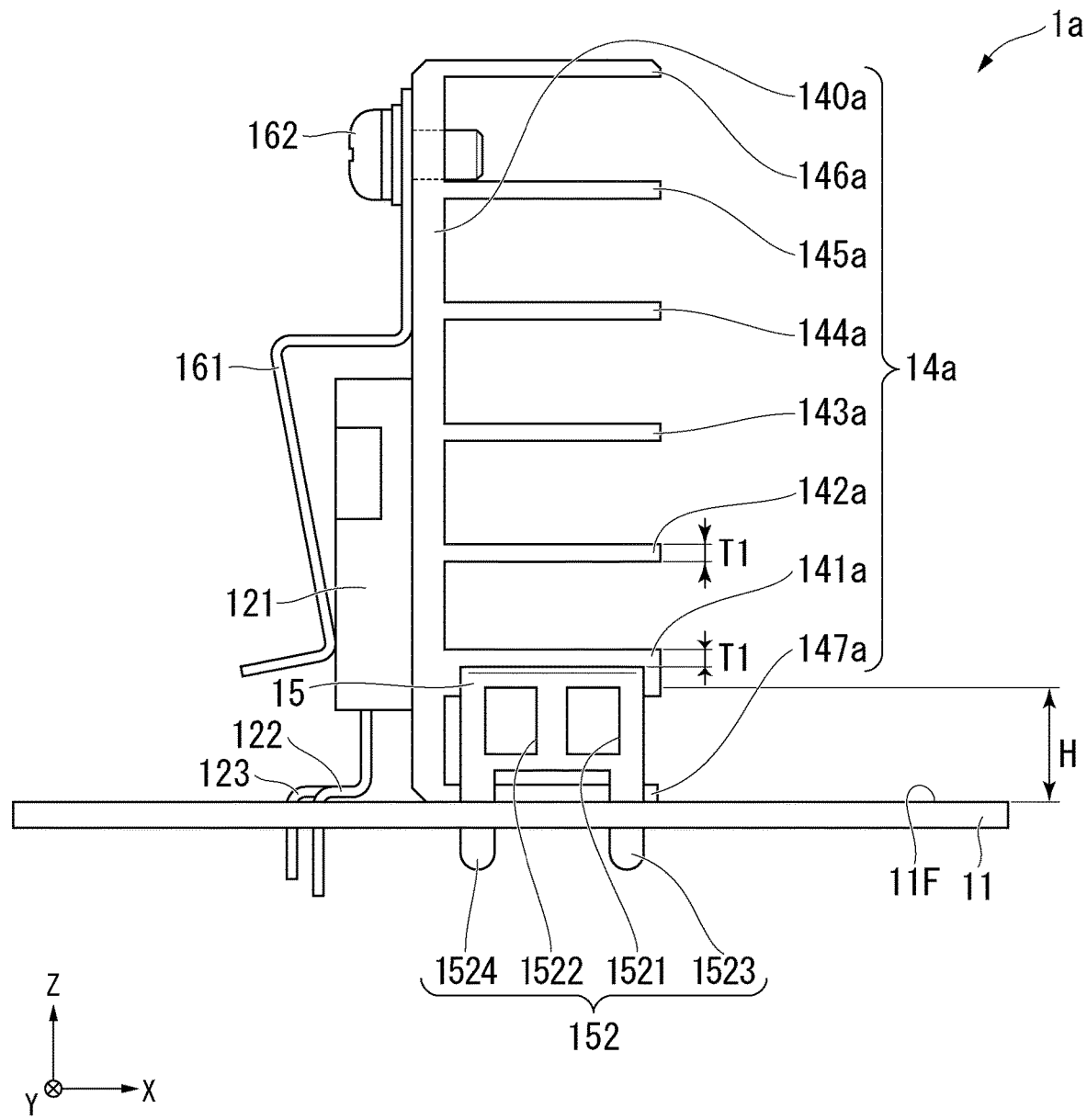
FIG. 2 is a side view showing an example of the configuration of the electric device according to the first embodiment.
Figure 3:
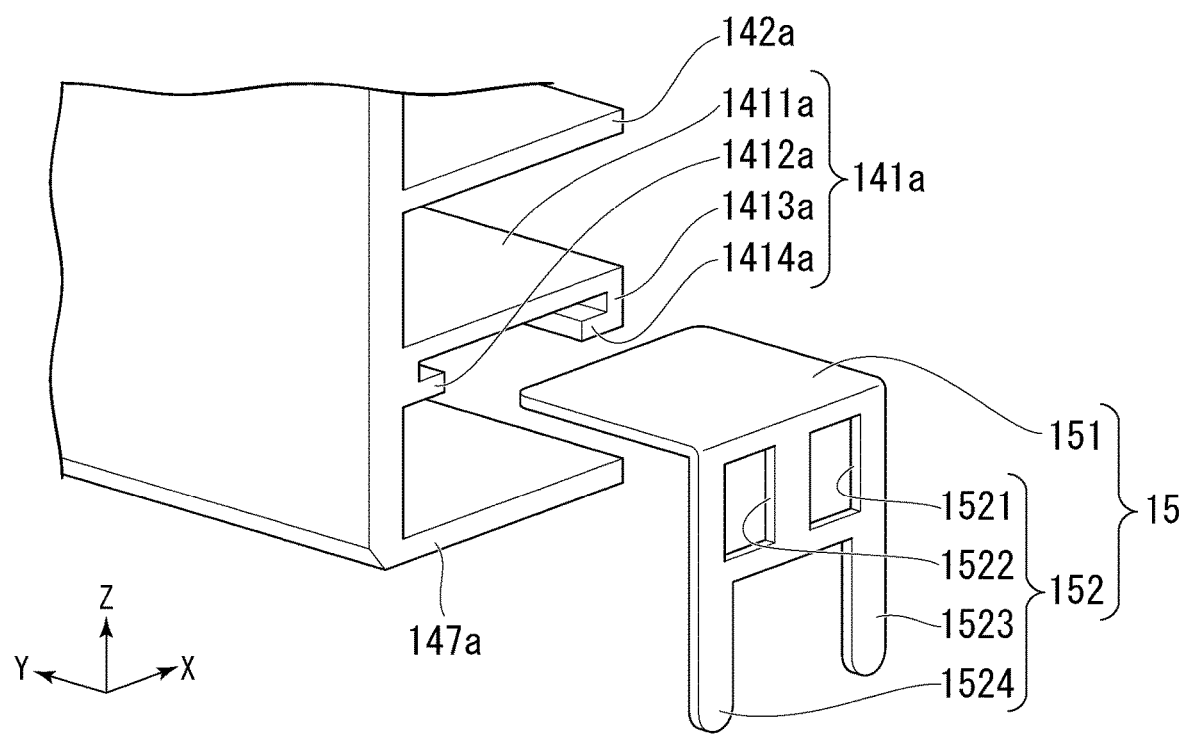
FIG. 3 is a perspective view showing an example of configurations of an attachment member, a first fin, and a second fin according to the first embodiment.
Figure 4:
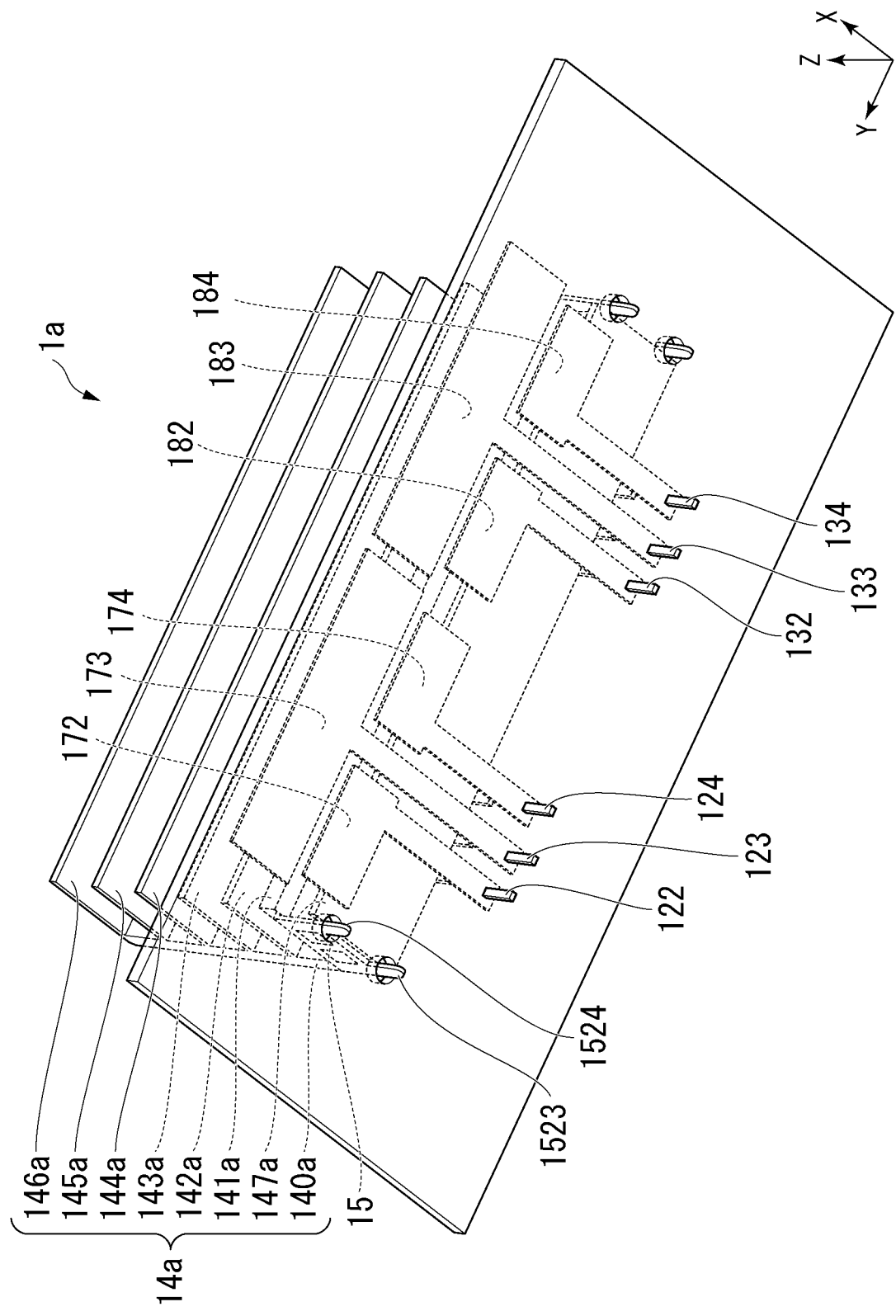
FIG. 4 is a perspective view showing an example of a configuration of a conductor foil according to the first embodiment.
Figure 5:
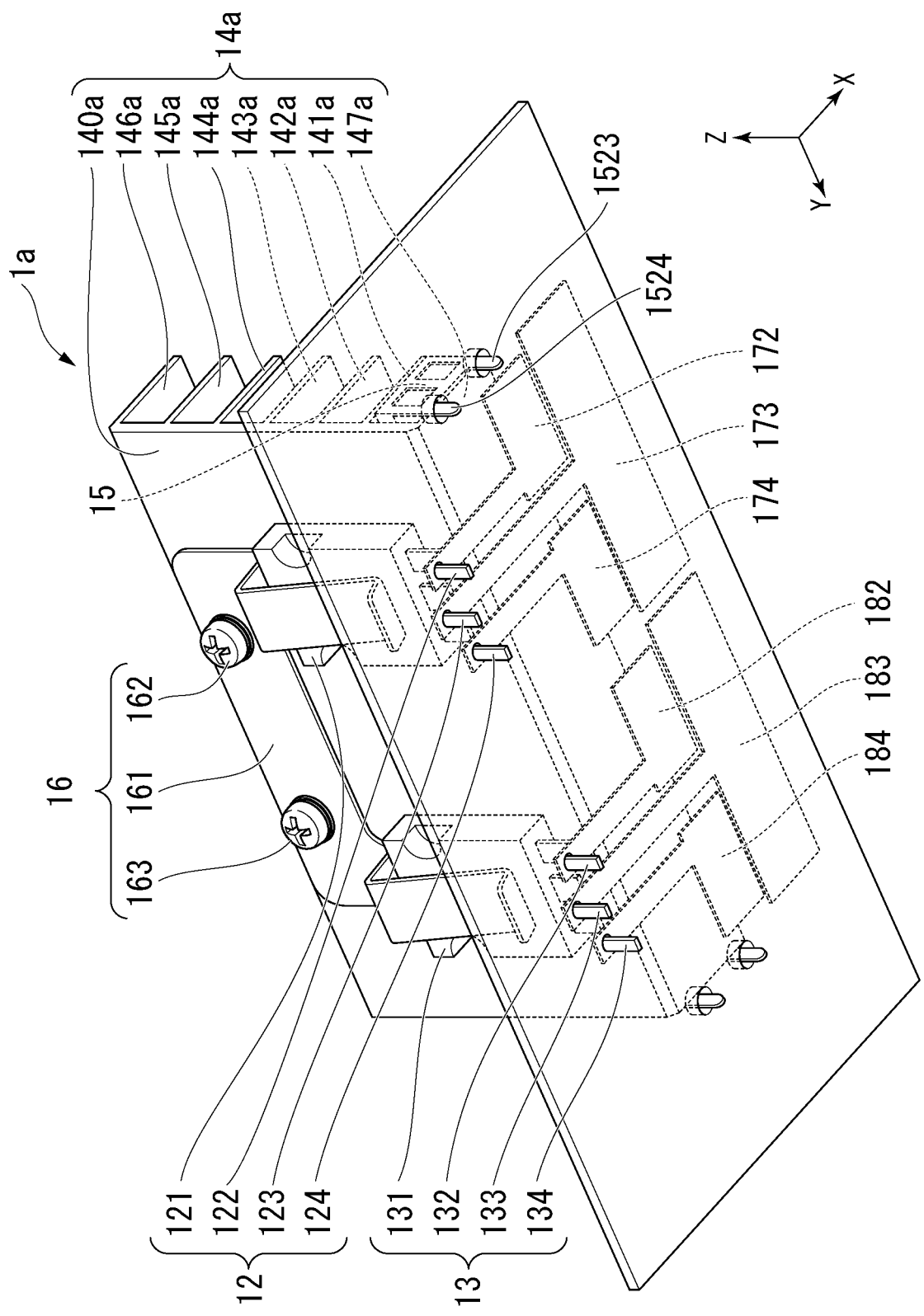
FIG. 5 is a perspective view showing an example of the configuration of the conductor foil according to the first embodiment.

An example of a configuration of an electric device according to a first embodiment will be described with reference to FIGS. 1 to 5. FIG. 1 is a perspective view showing an example of a configuration of an electric device according to the first embodiment. FIG. 2 is a side view showing an example of the configuration of the electric device according to the first embodiment. FIG. 3 is a perspective view showing an example of configurations of an attachment member, a first fin, and a second fin according to the first embodiment. FIG. 4 is a perspective view showing an example of a configuration of a conductor foil according to the first embodiment. FIG. 5 is a perspective view showing an example of the configuration of the conductor foil according to the first embodiment.

As shown in FIG. 1, the electric device 1a includes a substrate 11, an electronic component 12, an electronic component 13, a heat radiator 14a, an attachment member 15, and an electronic component fixing part 16. In the following description, as shown in FIG. 1, an X axis parallel to one side of the substrate 11, a Y axis parallel to one side of the substrate 11 and orthogonal to the X axis, and a Z axis perpendicular to a surface on which an area of the substrate 11 is the largest are used. Further, the X axis, the Y axis, and the Z axis form right-handed three-dimensional orthogonal coordinates.

The substrate 11 has an attachment surface 11F directed in a +Z direction, and an electronic component 12 and an electronic component 13 are attached on the attachment surface 11F. Moreover, the substrate 11 may be a high heat radiation substrate, and is produced, for example, by making an insulating layer of a glass epoxy substrate contain a heat conductive filler. The substrate 11 is formed, for example, in a substantially rectangular shape.

The electronic component 12 is, for example, a semiconductor element, and includes a main body part 121 and terminals 122, 123, and 124. Examples of the electronic component 12 is a transistor, an integrated circuit (IC), a diode, a resistor and the like. Similarly, the electronic component 13 is, for example, a semiconductor element, and includes a main body part 131 and terminals 132, 133, and 134. Similarly, examples of the electronic component 13 is a transistor, an integrated circuit (IC), a diode, a resistor and the like.

The heat radiator 14a includes a plate-like member 140a, first fins 141a, 142a, 143a, 144a, 145a, and 146a, and a second fin 147a.

The plate-like member 140a is a substantially rectangular plate-like member disposed to be perpendicular to the attachment surface 11F of the substrate 11, and is made of a material having excellent thermal conductivity. The main body part 121 of the electronic component 12 and the main body part 131 of the electronic component 13 are in contact with a surface of the plate-like member 140a directed in a −X direction. That is, the heat radiator 14a is thermally connected to the electronic component 12 and the electronic component 13.

The first fins 141a, 142a, 143a, 144a, 145a, and 146a are plate-like members formed in a substantially rectangular shape. Further, the first fins 141a, 142a, 143a, 144a, 145a, and 146a are thermally connected to the plate-like member 140a by connecting a long side on the −X direction side to a surface of the plate-like member 140a directed in the +X direction. The first fins 141a, 142a, 143a, 144a, 145a, and 146a are disposed at predetermined intervals in the Z direction, respectively. Further, the surfaces of the first fins 141a, 142a, 143a, 144a, 145a, and 146a directed in the +Z direction or the −Z direction are facing each other. The term "facing" as used herein means a state in which the surfaces having the largest area of the members on two flat plates face each other. Also, the heat radiator 14a may not include at least one of the first fins 141a, 142a, 143a, 144a, 145a, and 146a, and may include another first fin.

Further, as shown in FIG. 2, the first fins 141a and 142a have a thickness T1 in the Z direction. Further, the first fins 143a, 144a, 145a, and 146a have the same thickness T1.

Further, unlike other first fins 142a, 143a, 144a, 145a and 146a, the first fin 141a includes a flat plate part 1411a, a support part 1412a, a side plate part 1413a, and a support part 1414a as shown in FIG. 3. The flat plate part 1411a is formed in substantially the same shape as those of other first fins 142a, 143a, 144a, 145a, and 146a. The support part 1412a is a plate-like member formed in a substantially rectangular shape, and a long side on the −X direction side is connected to the surface of the plate-like member 140a directed in the +X direction. The side plate part 1413a is a plate-like member formed in a substantially rectangular shape extending in the −Z direction from the long side on the +X direction side of the flat plate part 1411a. The support part 1414a is a plate-like member formed in a substantially rectangular shape extending in the −X direction from the long side on the −Z direction side of the side plate part 1413a.

The second fin 147a is, for example, a plate-like member formed in a substantially rectangular shape. Further, the second fin 147a is thermally connected to the first fins 141a, 142a, 143a, 144a, 145a, and 146a. That is, the second fin 147a is thermally connected to the first fins 141a, 142a, 143a, 144a, 145a, and 146a, by connecting the long side on the −X direction to the surface of the plate-like member 140a directed in the +X direction. Further, the second fin 147a is provided on the same side as viewed from the surfaces directed in the +Z direction or the −Z direction of each of the first fins 141a, 142a, 143a, 144a, 145a, and 146a. Furthermore, the second fin 147a is provided at a position closer to the attachment surface 11F to the substrate 11 than the first fins 141a, 142a, 143a, 144a, 145a, and 146a.

The second fin 147a is facing the first fins 141a, 142a, 143a, 144a, 145a, and 146a. For example, the surface of the second fin 147a directed in the +Z direction or the −Z direction is facing the surface of the first fin 141a, 142a, 143a, 144a, 145a, and 146a directed in the +Z direction or the −Z direction, respectively.

Further, the second fin 147a is thermally connected to the attachment surface 11F of the substrate 11. For example, the surface of the second fin 147a directed in the −Z direction is in contact with the attachment surface 11F of the substrate 11. Specifically, the surface of the second fin 147a directed in the −Z direction is in close contact with the attachment surface 11F of the substrate 11.

As shown in FIG. 3, the attachment member 15 includes an insertion part 151 and a flat plate part 152.

The insertion part 151 is a plate-like member formed in a substantially rectangular shape, is inserted between the support parts 1412a and 1414a and the flat plate part 1411a, and is supported by the support part 1412a and the support part 1414a. The flat plate part 152 is a member that extends from one side of the insertion part 151 in a direction substantially perpendicular to the surface on which the area of the insertion part 151 is the largest, and covers a space sandwiched between the first fin 141a and the second fin 147a. Further, the flat plate part 152 includes a through hole 1521, a through hole 1522, a leg part 1523, and a leg part 1524. Also, as shown in FIG. 2, the leg part 1523 and the leg part 1524 are inserted into holes provided in the substrate 11.

That is, as shown in FIG. 2, one end of the attachment member 15 is attached to a portion which is a part of the first fin 141a and in which a height H with respect to the attachment surface 11F of the substrate 11 is higher than a thickness T1 of the first fin 141a. Further, as shown in FIGS. 1 and 2, the other end of the attachment member 15 is attached to the substrate 11.

In addition, the insertion part 151 may be included an engagement part to be more firmly attached to the first fin 141a. The engagement part is, for example, a flat plate-like protrusion formed by notching a part of the insertion part 151 and bending the insertion part 151 at an acute angle from a surface parallel to an XY plane of the insertion part 151 to the −Z direction side. Further, the engagement part bends starting from a portion bent at an acute angle, and firmly joins the first fin 141a and the attachment member 15 by pressing a tip thereof to the support part 1412a or the support part 1414a. Further, in this case, the first fin 141a may be included a protrusion, a recessed portion, and the like for engaging with the engagement part in at least part of a flat plate part 1411*a*, a side plate part 1413*a*, a support part 1412*a* and a support part 1414*a*.

The electronic component fixing unit 16 includes a pressing member 161, a screw 162, and a screw 163. As shown in FIGS. 1 and 2, the pressing member 161 is fixed in a partially close contact state to the plate-like member 140*a* of the heat radiator 14*a* by the screw 162 and the screw 163, and maintains a state of bringing the main body part 121 of the electronic component 12 and the main body part 131 of the electronic component 13 into close contact with the plate-like member 140*a*. In addition, the electronic component fixing part 16 can take an arbitrary structure which can bring the electronic component 12 and the electronic component 13 into thermal contact with the heat radiator 14*a*.

As shown in FIGS. 4 and 5, the substrate 11 includes conductor foils 172, 173, 174, 182, 183, and 184. The conductor foils 172, 173, 174, 182, 183, and 184 are embedded in the substrate 11, for example, in a state of facing the attachment surface 11F of the substrate 11, and are used as wiring for an electronic circuit or are used for heat radiation from the heat radiator 14*a*, the electronic component 12 and the electronic component 13. The conductor foils 172, 173, 174, 182, 183, and 184 are made of, for example, copper and gold, and are preferably made of copper when considering high electrical conductivity and a reduction in manufacturing costs.

The conductor foil 172 is electrically connected to the terminal 122 of the electronic component 12 by solder or the like. Similarly, the conductor foils 173, 174, 182, 183, and 184 are electrically connected to the terminals 123, 124, 132, 133, and 134, by solder or the like, respectively. Further, the conductor foils 172, 173, 174, 182, 183 and 184 overlap at least partially the second fin 147*a* in the direction perpendicular to the attachment surface 11F of the substrate 11.

The electric device 1*a* according to the first embodiment has been described above. In the electric device 1*a*, the heat radiator 14*a* is thermally connected to the electronic component 12 and the electronic component 13 by attaching one end of the attachment member 15 for being attached to the substrate 11 to the portion which is a part of the first fin 141*a* and in which the height with respect to the attachment surface 11F of the substrate 11 is higher than the thickness T1 of the first fin 141*a*.

As a result, by setting the height H of the position to which the insertion part 151 of the attachment member 15 is inserted to be sufficiently high in the electric device 1*a*, it is possible to suppresses vibration of the heat radiator 14*a* when external stresses such as vibration and impact are applied from the outside, and to easily avoid a situation in which the electronic component 12 and the electronic component 13 are damaged. Here, the situation in which the electronic component 12 is damaged means a situation in which a solder or the like for electrically connecting the terminals 122, 123 or 124 and the conductor foils 172, 173 or 174 is cracked by the vibration of the heat radiator 14*a*, and the electronic component 12 cannot exhibit its original performance. This also applies to a situation in which the electronic component 13 is damaged.

Further, the second fin 147*a* may be thermally connected to the attachment surface 11F of the substrate 11. Therefore, the electric device 1*a* can efficiently release heat, which is transferred from the electronic component 12 and the electronic component 13 to the heat radiator 14*a*, to the substrate 11.

Further, the attachment member 15 may be included a through hole 1521 and a through hole 1522 that open toward a space between the first fin 141*a* and the second fin 147*a*. Therefore, the electric device 1*a* can suppress the flow of the air passing between the first fin 141*a* and the second fin 147*a* from being inhibited by the attachment member 15, and can improve the heat radiation characteristics.

In addition, the electric device 1*a* may be included conductor foils 172, 173, 174, 182, 183 and 184 that face the attachment surface 11F of the substrate 11 and at least partially overlap the second fin 147*a* in a direction perpendicular to the attachment surface 11F. Therefore, the electric device 1*a* can efficiently release the heat, which is transferred to the second fin 147*a*, to the conductor foils 172, 173, 174, 182, 183, and 184 through the substrate 11.

Further, the conductor foils 172, 173, 174, 182, 183, and 184 may be wirings electrically connected to the terminals 122, 123 and 124 of the electronic component 12 and the terminals 132, 133 and 134 of the electronic component 13, respectively. Therefore, the electric device 1*a* can efficiently release the heat generated in the main body part 121 of the electronic component 12 and the main body part 131 of the electronic component 13 to the conductor foils 172, 173, 174, 182, 183, and 184.

Further, the substrate 11 may be a high heat radiation substrate. Therefore, the electric device 1*a* can efficiently release the heat, which is transferred from the electronic component 12 and the electronic component 13 to the substrate 11, into the air.

Further, in the first embodiment, although a case in which all of the first fins 141*a*, 142*a*, 143*a*, 144*a*, 145*a* and 146*a* have the same thickness T1 and the same shape is described as an example, the present invention is not limited thereto. That is, the thicknesses and shapes of the first fins 141*a*, 142*a*, 143*a*, 144*a*, 145*a*, and 146*a* may be the same or different.

Further, in the first embodiment, although a case in which the insertion part 151 of the attachment member 15 is inserted into the first fin 141*a* is described as an example, the present invention is not limited thereto. That is, the electric device 1*a* may be included an attachment member that inserts the insertion part into the first fins 142*a*, 143*a*, 144*a*, 145*a*, or 146*a*. In this case, it is preferable that the attachment member has a through hole formed in a flat plate part which covers a space sandwiched between the two first fins. Therefore, it is possible to suppress the flow of the air passing between two first fins from being inhibited by the attachment member, and to improve heat radiation characteristics.

Further, the heat radiator 14*a* and the attachment member 15 may be formed separately or integrally.

Second Embodiment

Figure 6:
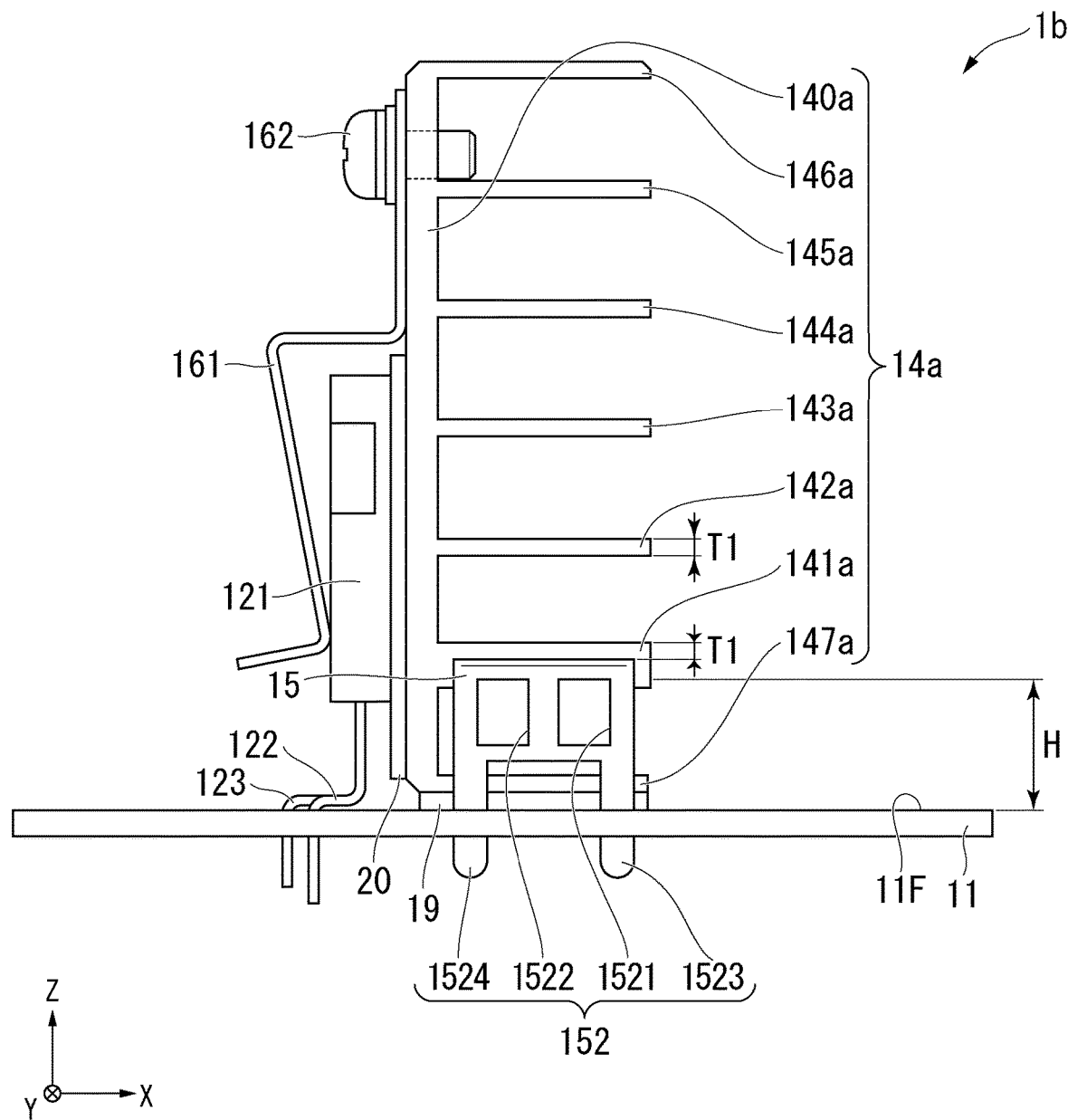
FIG. 6 is a side view showing an example of a configuration of an electric device according to a second embodiment.

An example of a configuration of an electric device according to a second embodiment will be described with reference to FIG. 6. FIG. 6 is a side view showing an example of the configuration of the electric device according to the second embodiment. Further, in the description of the second embodiment, the repeated description of that of the first embodiment will not be provided.

As shown in FIG. 6, an electric device 1*b* according to the second embodiment includes a first member 19 and a second member 20, in addition to the same components as that of the electric device 1*a* according to the first embodiment.

The first member 19 is sandwiched between the second fin 147*a* and the attachment surface 11F, and has thermal conductivity and insulating properties. The second member 20 is sandwiched between the electronic component 12, the electronic component 13 and the heat radiator 14*a*, and has thermal conductivity and insulating properties. The first member 19 and the second member 20 are made of, for example, a material containing a thermally conductive filler such as aluminum oxide in silicone.

The electric device 1b according to the second embodiment has been described above. The electric device 1b may be included a first member 19 which is sandwiched between the second fin 147a and the attachment surface 11F, and has thermal conductivity and insulating properties. As a result, the electric device 1b can efficiently release heat, which is transmitted from the electronic component 12 and the electronic component 13 to the heat radiator 14a, to the substrate 11, by filling a fine gap between the second fin 147a and the attachment surface 11F of the substrate 11 to reduce the contact thermal resistance.

Moreover, the electric device 1b may be included a second member 20 which is sandwiched between the electronic component 12, the electronic component 13 and the heat radiator 14a and has thermal conductivity and insulating properties. Therefore, the electric device 1b can efficiently release heat from the electronic component 12 and the electronic component 13 to the heat radiator 14a, by filling a fine gap between the main body part 121 of the electronic component 12, the main body part 131 of the electronic component 13 and the plate-like member 140a of the heat radiator 14a to reduce the contact thermal resistance. In particular, when a portion made of a metal having electrical conductivity is exposed in the main body part 121 of the electronic component 12 and the main body part 131 of the electronic component 13, since the second member 20 has thermal conductivity while reliably ensuring insulating properties, it is useful.

Further, the electric device 1b may not include the first member 19. In this case, the surface of the second fin 147a directed in the −Z direction and the attachment surface 11F of the substrate 11 are in direct contact with each other. Further, the electric device 1b may not have the second member 20. In this case, the plate-like member 140a, the main body part 121 of the electronic component 12, and the main body part 131 of the electronic component 13 are in direct contact with one another.

Third Embodiment

Figure 7:
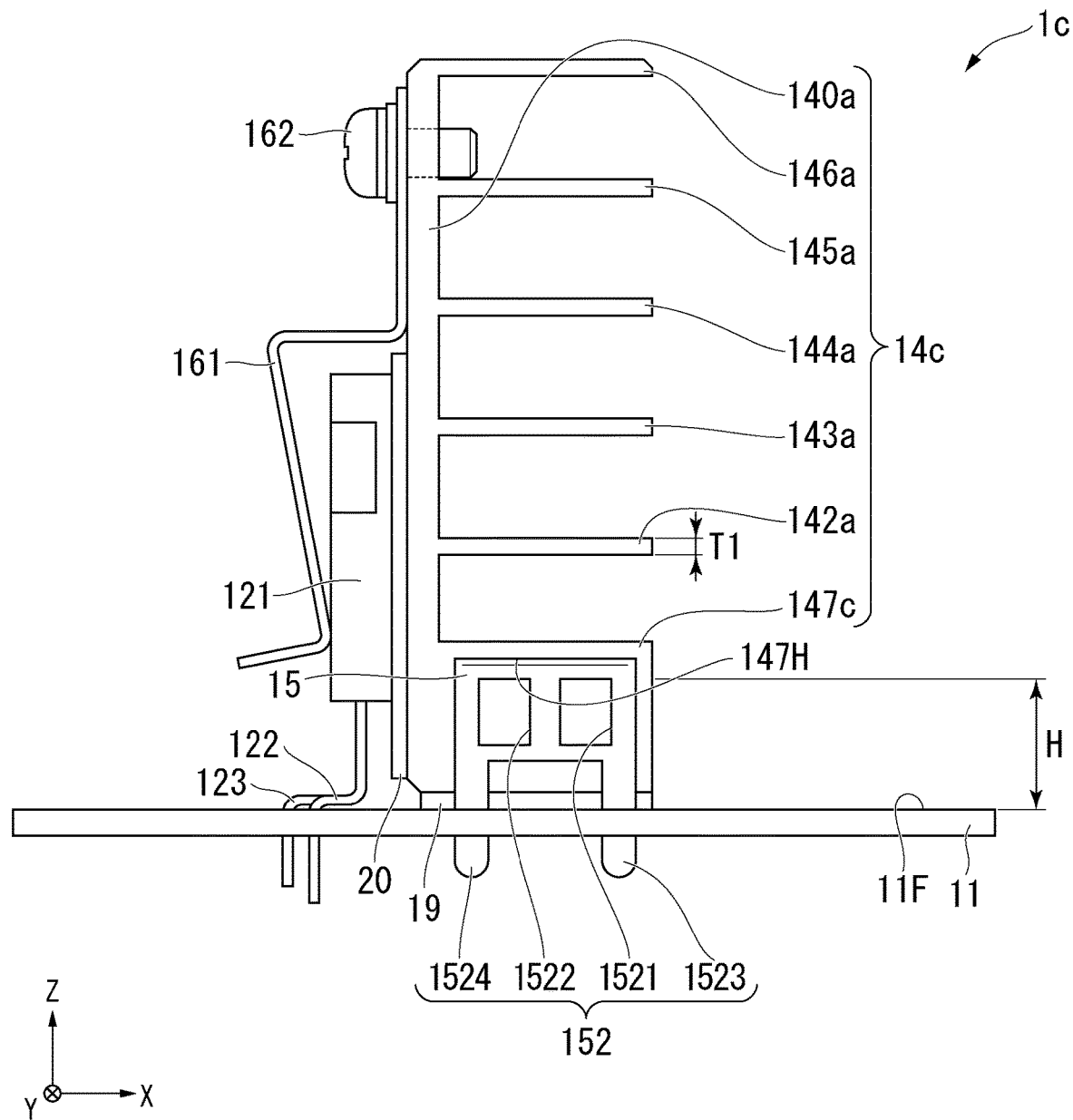
FIG. 7 is a side view showing an example of a configuration of an electric device according to a third embodiment.

An example of a configuration of an electric device according to a third embodiment will be described with reference to FIG. 7. FIG. 7 is a side view showing an example of the configuration of the electric device according to the third embodiment. Further, in the description of the third embodiment, the repeated description of those of the first embodiment or the second embodiment will not be provided.

An electric device 1c according to the third embodiment includes a heat radiator 14c shown in FIG. 7, instead of the heat radiator 14a according to the first embodiment and the second embodiment. Moreover, other constituent elements included in the electric device 1c are the same as the constituent elements included in the electric device 1b according to the second embodiment.

The heat radiator 14c includes the same plate-like member 140a, and first fins 142a, 143a, 144a, 145a, and 146a as those of the heat radiator 14a according to the first and second embodiments. On the other hand, the heat radiator 14c includes a second fin 147c instead of the first fin 141a and the second fin 147a included in the heat radiator 14a according to the first and second embodiments.

The second fin 147c is, for example, a member formed in a substantially rectangular parallelepiped shape, and a surface directed in the −X direction is thermally connected to the plate-like member 140a. That is, the second fin 147c is thermally connected to t the first fins 142a, 143a, 144a, 145a, and 146a, by connecting the long side on the −X direction to the surface directed in the +X direction of the plate-like member 140a. Further, the second fin 147c is provided on the same side as viewed from the first fins 142a, 143a, 144a, 145a, and 146a.

Further, the second fin 147c is thicker than the first fins 142a, 143a, 144a, 145a, and 146a having the thickness T1 in the Z direction, and has a hole 147H into which the insertion part 151 of the attachment member 15 is inserted.

As shown in FIG. 7, one end of the attachment member 15 is attached to a portion which is a part of the second fin 147c and in which a height H with respect to the attachment surface 11F of the substrate 11 is higher than the thickness T1 of the first fin 142a. Specifically, the insertion part 151 of the attachment member 15 is inserted into a hole 147H provided at a position of a height H with respect to the attachment surface 11F of the substrate 11. Further, the other end of the attachment member 15 is attached to the substrate 11.

The electric device 1c according to the third embodiment has been described above. In the electric device 1c, the heat radiator 14c is thermally connected to the electronic component 12 and the electronic component 13, by attaching one end of an attachment member for being attached to the substrate 11 to a portion which is a part of the second fin 147c and in which a height with respect to the attachment surface 11F of the substrate 11 is higher than the thickness T1 of the second fin 147c.

As a result, by setting the height H of the position to which the insertion part 151 of the attachment member 15 is inserted to be sufficiently high in the electric device 1c, it is possible to suppress vibration of the heat radiator 14c when external stress such as vibration or impact is applied from the outside, and to easily avoid a situation in which the electronic component 12 and the electronic component 13 are damaged.

Further, the electric device 1c may not include the first member 19. In this case, the surface of the second fin 147c directed in the −Z direction and the attachment surface 11F of the substrate 11 are in direct contact with each other. Further, the electric device 1c may not include the second member 20. In this case, the plate-like member 140a, the main body part 121 of the electronic component 12, and the main body part 131 of the electronic component 13 are in direct contact with each other.

Fourth Embodiment

Figure 8:
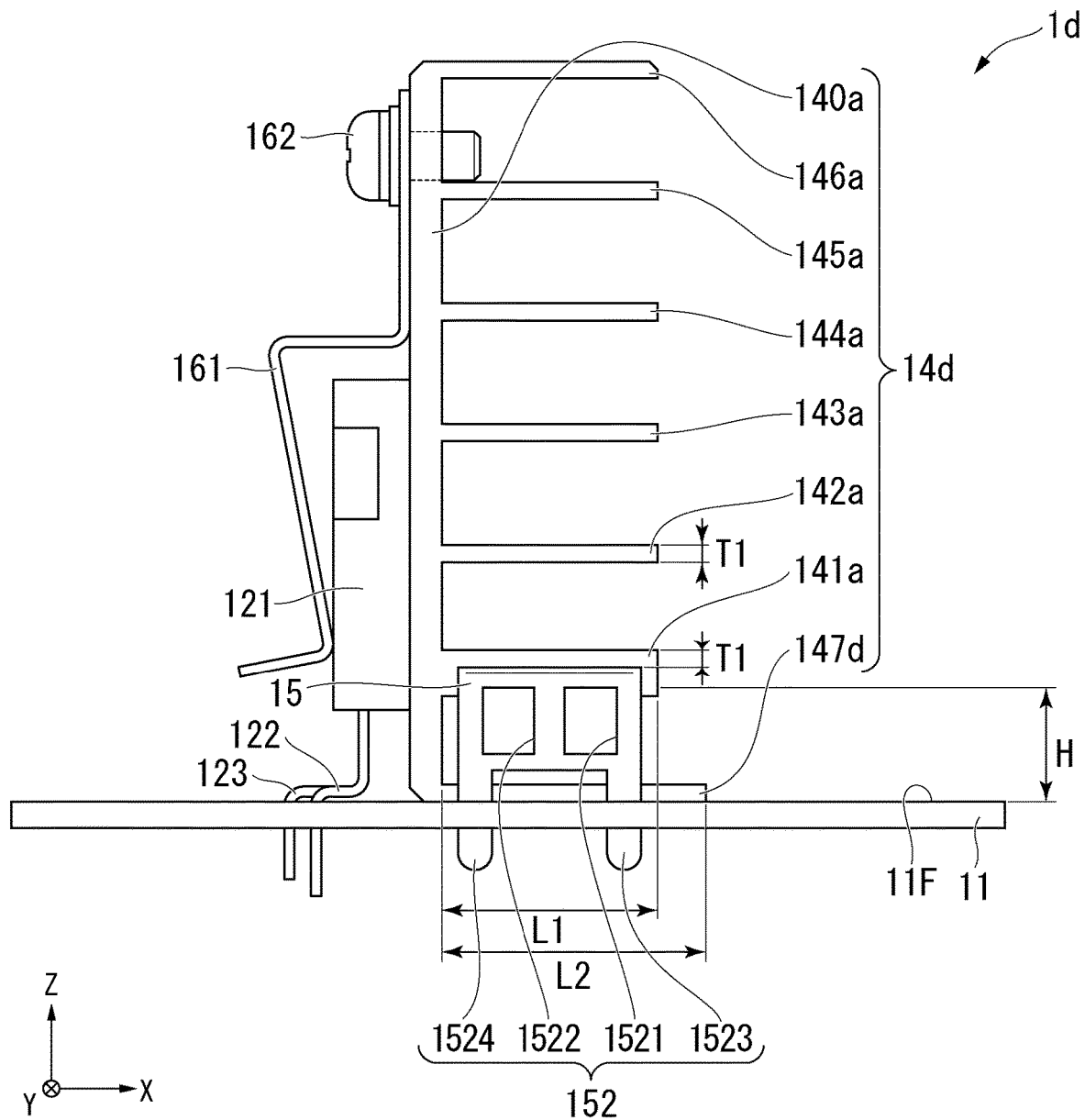
FIG. 8 is a side view showing an example of a configuration of an electric device according to a fourth embodiment.

An example of the configuration of the electric device according to the fourth embodiment will be described with reference to FIG. 8. FIG. 8 is a side view showing an example of the configuration of the electric device according to the fourth embodiment. Further, in the description of the fourth embodiment, the repeated description of those of the first embodiment, the second embodiment or the third embodiment will not be provided.

An electric device 1d according to the fourth embodiment includes a heat radiator 14d shown in FIG. 8 instead of the heat radiator 14a according to the first embodiment and the second embodiment. Moreover, other constituent elements included in the electric device 1d are the same as the constituent elements included in the electric device 1a according to the first embodiment.

The heat radiator 14d includes the same plate-like member 140a and first fins 141a, 142a, 143a, 144a, 145a, and 146a as those of the heat radiator 14a according to the first embodiment and the second embodiment. On the other hand, the heat radiator 14d includes a second fin 147d instead of the second fin 147a included in the heat radiator 14a according to the first and second embodiments.

The second fin 147d is, for example, a member formed in a substantially rectangular parallelepiped shape, and a surface directed in the −X direction is thermally connected to the plate-like member 140a. That is, the second fin 147d is thermally connected the first fins 141a, 142a, 143a, 144a, 145a, and 146a, by connecting the long side on the −X direction to the surface directed in the +X direction of the plate-like member 140a. Further, the second fin 147d is provided on the same side as viewed from the first fins 141a, 142a, 143a, 144a, 145a, and 146a.

In addition, in the direction parallel to the attachment surface 11F, the length of the second fin 147d with respect to the plate-like member 140a is longer than the lengths of the first fin 141a, 142a, 143a, 144a, 145a and 146a with respect to the plate-like member 140a. For example, as shown in FIG. 8, in the +X direction parallel to the attachment surface 11F, a length L2 of the second fin 147d with respect to the surface of the plate-like member 140a directed in the +X direction is longer than the lengths L1 of the first fins 141a, 142a, 143a, 144a, 145a, and 146a with respect to the surface of the plate-like member 140a directed in the +X direction.

The electric device 1d according to the fourth embodiment has been described above. In the heat radiator 14d included in the electric device 1d, the length L2 of the second fin 147d with respect to the plate-like member 140a in the direction parallel to the attachment surface 11F is longer than the lengths L1 of the first fins 141a, 142a, 143a, 144a, 145a, and 146a with respect to the plate-like member 140a.

Therefore, an area in which the attachment surface 11F of the substrate 11 and the heat radiator 14d are in contact with each other increases. Therefore, the electric device 1d can suppress the vibration of the heat radiator 14a when external stress such as vibration and impact is applied from the outside, and can easily avoid a situation in which the electronic component 12 and the electronic component 13 are damaged.

Further, in the first to fourth embodiments described above, although the case in which the heat radiators 14a, 14c or 14d and the attachment member 15 are separate parts has been described as an example, the present invention is not limited thereto. That is, the attachment member 15 may be formed integrally with the heat radiators 14a, 14c or 14d. As a method of integrally forming the attachment member 15 and the heat radiators 14a, 14c or 14d, for example, die casting may be used. For example, the attachment member 15 is formed integrally with the first fin 141a described above. Alternatively, the attachment member 15 is formed integrally with the second fin 141c described above.

While preferred embodiments of the invention have been described and shown above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES 1a, 1b, 1c, 1d Electric device
11 Substrate
11F Attachment surface
12, 13 Electronic component
121 Main body part
122, 123, 124, 132, 133, 134 Terminal
14a, 14c, 14d Heat radiator
140a Plate-like member
141a, 142a, 143a, 144a, 145a, 146a First fin
147a, 147c, 147d Second fin
147H Hole
1411a Flat plate part
1412a, 1414a Support part
1413a Side plate part
15 Attachment member
151 Insertion part
152 Flat plate part
1521, 1522 Through hole
1523, 1524 Leg part
16 Electronic component fixing part
161 Pressing member
162, 163 Screw
172, 173, 174, 182, 183, 184 Conductor foil
19 First member
20 Second member
H Height
L1, L2 Length
T1 Thickness

What is claimed is:

1. An electric device comprising:
a substrate;
an electronic component attached to the substrate; and
a heat radiator including a first fin, and a second fin facing the first fin, thermally connected to the first fin, and provided at a position closer to an attachment surface of the substrate than the first fin,
wherein the heat radiator is thermally connected to the electronic component, and
one end of an attachment member is attached to the first fin, and another end of the attachment member is attached to the substrate, the attachment member having a height with respect to the attachment surface that is higher than a thickness of the first fin.

2. The electric device according to claim 1, wherein the attachment member includes a through hole formed in a flat plate part which covers a space sandwiched between two first fins or a space sandwiched between the first fin and the second fin.

3. The electric device according to claim 1, wherein the second fin is thicker than the first fin.

4. The electric device according to claim 3, wherein the attachment member is formed integrally with one end of the first fin.

5. The electric device according to claim 1, wherein the second fin is thermally connected to the attachment surface.

6. The electric device according to claim 5, wherein the second fin is in contact with the attachment surface.

7. The electric device according to claim 5, further comprising:

a first member sandwiched between the second fin and the attachment surface and having thermal conductivity and insulating properties.

8. The electric device according to claim 1, wherein a conductor foil facing the attachment surface is embedded in the substrate, and
the second fin at least partially overlaps the conductor foil in a direction perpendicular to the attachment surface.

9. The electric device according to claim 8, wherein the conductor foil is a wiring electrically connected to a terminal of the electronic component.

10. The electric device according to claim 1, wherein the substrate is a high heat radiation substrate.

11. The electric device according to claim 1, further comprising:
a member sandwiched between the electronic component and the heat radiator and having thermal conductivity and insulating properties.

12. An electric device comprising:
a substrate;
an electronic component attached to the substrate;
a heat radiator including a first fin, and a second fin facing the first fin, thermally connected to the first fin, and provided at a position closer to an attachment surface of the substrate than the first fin; and
a plate-like member which is disposed to be perpendicular to the attachment surface of the substrate and to which the first fin and the second fin are thermally connected,
wherein the heat radiator is thermally connected to the electronic component, and one end of an attachment member is attached to the first fin, and another end of the attachment member is attached to the substrate, the attachment member having a height with respect to the attachment surface that is higher than a thickness of the first fin,
wherein the plate-like member has a face that connects to the first fin and the second fin, and
wherein a length from the face to a tip of the second fin in a direction parallel to the attachment surface that is perpendicular to the face is longer than a length from the face to a tip of the first fin in the direction.

13. A heat radiator comprising:
a first fin; and a second fin facing the first fin, thermally connected to the first fin, and provided on the same side as viewed from the first fin,
wherein one end of an attachment member is attached to the first fin, and another end of the attachment member is attached to a substrate, the attachment member having a height with respect to an attachment surface of the substrate that is higher than a thickness of the first fin, and
the second fin is provided at a position closer to the attachment surface of the substrate than the first fin.

14. A heat radiator comprising:
a first fin;
a second fin facing the first fin, thermally connected to the first fin, and provided on the same side as viewed from the first fin; and
a plate-like member which is disposed to be perpendicular to an attachment surface of a substrate and to which the first fin and the second fin are thermally connected,
wherein one end of an attachment member that attaches to the substrate is also attached to a portion which is a part of the first fin, the attachment member having a height with respect to the attachment surface of the substrate that is higher than a thickness of the first fin,
wherein the plate-like member has a face that connects to the first fin and the second fin,
wherein a length from the face to a tip of the second fin in a direction parallel to the attachment surface that is perpendicular to the face is longer than a length from the face to a tip of the first fin in the direction, and
the second fin is provided at a position closer to the attachment surface of the substrate than the first fin.

* * * * *